United States Patent
Cical et al.

(10) Patent No.: US 8,384,472 B2
(45) Date of Patent: Feb. 26, 2013

(54) CIRCUIT FOR AND METHOD OF REDUCING POWER CONSUMPTION IN INPUT PORTS OF AN INTEGRATED CIRCUIT

(75) Inventors: Ionut C. Cical, Dublin (IE); Edward Cullen, Clane (IE)

(73) Assignee: Xilinx, Inc., San Jose, CA (US)

( * ) Notice: Subject to any disclaimer, the term of this patent is extended or adjusted under 35 U.S.C. 154(b) by 27 days.

(21) Appl. No.: 12/361,014

(22) Filed: Jan. 28, 2009

(65) Prior Publication Data
US 2010/0188142 A1    Jul. 29, 2010

(51) Int. Cl.
*G05F 1/10* (2006.01)
*G05F 3/02* (2006.01)

(52) U.S. Cl. ......... 327/544; 327/538; 327/539; 327/540

(58) Field of Classification Search .................. 327/530, 327/538–543, 546; 323/312–317
See application file for complete search history.

(56) References Cited

U.S. PATENT DOCUMENTS

| | | | |
|---|---|---|---|
| 5,977,819 A | 11/1999 | Sanwo et al. | |
| 6,114,898 A | 9/2000 | Okayasu | |
| 6,232,824 B1 * | 5/2001 | Kono | 327/530 |
| 6,236,393 B1 * | 5/2001 | Ogawa et al. | 345/211 |
| 6,825,692 B1 | 11/2004 | Chung et al. | |
| 6,897,713 B1 * | 5/2005 | Nguyen et al. | 327/541 |
| 7,227,381 B2 * | 6/2007 | Kim | 326/86 |
| 8,058,924 B1 * | 11/2011 | Ren et al. | 327/540 |
| 2005/0134313 A1 * | 6/2005 | Kim | 326/86 |
| 2005/0206445 A1 * | 9/2005 | Nguyen et al. | 327/541 |
| 2006/0062313 A1 * | 3/2006 | Huber | 375/257 |
| 2006/0232326 A1 * | 10/2006 | Seitz et al. | 327/539 |
| 2007/0085601 A1 * | 4/2007 | Idei et al. | 327/558 |
| 2007/0296487 A1 * | 12/2007 | Kuriyama | 327/543 |

* cited by examiner

*Primary Examiner* — Lincoln Donovan
*Assistant Examiner* — Brandon S Cole
(74) *Attorney, Agent, or Firm* — John J. King

(57) ABSTRACT

A circuit for reducing power consumption in input ports of an integrated circuit is disclosed. The circuit comprises a plurality of receiver circuits of the integrated circuit for receiving input signals coupled to the integrated circuit; and a bias current generator coupled to the plurality of receiver circuits, the bias current generator providing a bias voltage for each receiver circuit of the plurality of receiver circuits to mirror the current in the bias current generator in each of the receiver circuits. A method of reducing power consumption in input ports of an integrated circuit is also disclosed.

20 Claims, 5 Drawing Sheets

CIRCUIT FOR AND METHOD OF REDUCING POWER CONSUMPTION IN INPUT PORTS OF AN INTEGRATED CIRCUIT

FIELD OF THE INVENTION

The present invention relates generally to integrated circuits, and in particular, to a circuit for and a method of reducing power consumption in input ports of an integrated circuit.

BACKGROUND OF THE INVENTION

Integrated circuits are an important part of any electronic device. As more electronic devices rely upon battery power, it is important to reduce the power consumption in integrated circuits. One portion of an electronic device which consumes power is an input/output (I/O) port coupled to receive an input signal or generate an output signal. The power required in a particular circuit and overall in an integrated circuit may vary based upon the process, voltage and temperature, also known as PVT, associated with the integrated circuit. That is, depending upon the process used to manufacture the components such as transistors of the integrated circuit, the supply voltage applied to the integrated circuit, or the temperature of the integrated circuit or a portion of the integrated circuit, the power consumption of a given circuit will vary.

Conventional circuits and methods for implementing I/O ports use a local-biased amplifier in each I/O port. Not only do these local-biased amplifiers consume additional area on the integrated circuit, but they have high power consumption over various PVT combinations. More particularly, the power consumption will vary depending upon a supply voltage applied to the device. In order to reduce power consumption, it is beneficial to provide a circuit which is independent of variations in the PVT variables.

SUMMARY OF THE INVENTION

A circuit for reducing power consumption in input ports of an integrated circuit. The circuit comprises a plurality of receiver circuits of the integrated circuit for receiving input signals coupled to the integrated circuit; and a bias current generator coupled to the plurality of receiver circuits, the bias current generator providing a bias voltage for each receiver circuit of the plurality of receiver circuits to mirror the current in the bias current generator in each of the receiver circuits.

According to an alternate embodiment, a circuit for reducing power consumption in input ports of an integrated circuit comprises a plurality of receiver circuits of the integrated circuit for receiving input signals coupled to the integrated circuit; and a bias current generator coupled to the plurality of receiver circuits, the bias current generator comprising a first amplifier coupled to receive a first fixed voltage and to generate a first fixed current and a second amplifier coupled to generate a reference voltage based upon the first fixed current, wherein the bias current generator provides the reference voltage to each receiver circuit of the plurality of receiver circuits A method of reducing power consumption in input ports of an integrated circuit is also disclosed. The method comprises receiving a fixed voltage; generating a first fixed current based upon the fixed voltage in a first path of a current mirror circuit; generating a second fixed current in a second path of a current mirror circuit; coupling a reference voltage based upon the second fixed current to a plurality of receivers of the integrated circuit; and generating a fixed current in each receiver of the plurality of receivers for receiving input signals coupled to the integrated circuit, the fixed current in the plurality of receivers being based upon the reference voltage.

DETAILED DESCRIPTION OF THE DRAWINGS

Figure 1:
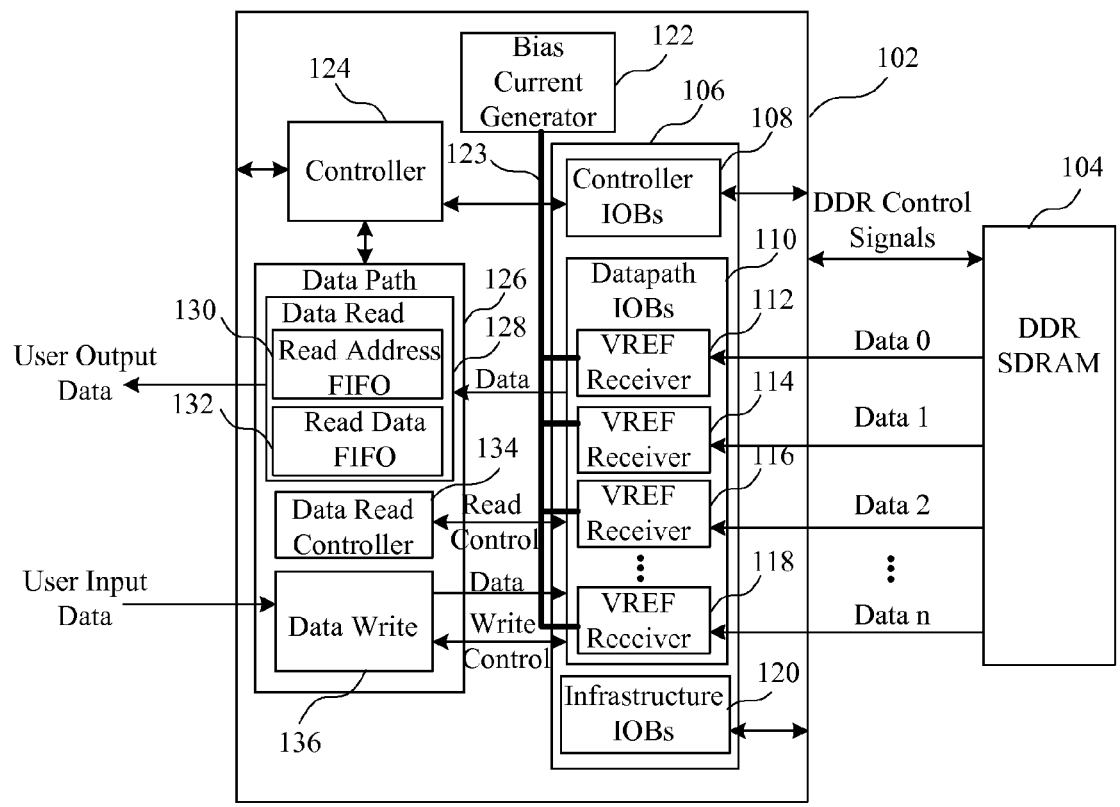
FIG. 1 is a block diagram of a circuit for reducing power consumption in an input port of an integrated circuit according to an embodiment of the present invention.

Turning first to FIG. 1, a block diagram of a circuit for reducing power consumption in an input port of an integrated circuit according to an embodiment the present invention is shown. A device 102 is coupled to a memory 104. The device 102 may be an integrated circuit, such as a device having programmable logic as will be described in more detail below. The memory 104 may be a random access memory, such as a double data rate (DDR) synchronous dynamic random access memory (SDRAM). The device 102 and the memory 104 may comprise separate integrated circuits, or may be a part of a single integrated circuit. Device 102 comprises an input/output bank 106 comprising various I/O ports, and more particularly comprises various input/output blocks (IOBs). A controller IOBs block 108 enables coupling control signals to the memory 104, such as DDR control signals coupled to a DDR SDRAM. A datapath IOB block 110 comprises a plurality of differential receivers comprising amplifiers. In particular, "n" VREF receivers are shown in FIG. 1, where VREF receivers 112-118 are coupled to receive data signals Data 0 through Data n, respectively. As will be described in more detail below, the VREF receivers receive an input signal, and compare the input signal to a voltage reference to determine the value at the input. However, as will be described in reference to FIG. 4, the circuits and methods of the present invention may be applied to any differential receiver, such as a low-voltage differential signaling (LVDS) receiver. The device 102 may also comprise infrastructure IOBs 120 for coupling signals to devices outside of the device 102 other than the memory. As will be described in more detail below, a bias current generator 122 enables generating a reference current in each of the VREF receivers by way of a reference voltage node 123.

A controller 124 is also coupled to the input/output bank 106 to provide control signals to the input/output bank 106. Finally, a data path control circuit 126 enables reading from and writing to the memory 104 by way of the VREF receivers. In particular, a data read circuit 128 comprises a read address FIFO 130 and a read data FIFO 132 enabling reading data from the datapath IOBs and generating user output data. Similarly, a data read controller 134 communicates read control signals with the datapath IOBs, while the data write circuit 136 receives user input data and provides data and write control signals to the data path IOBs.

As will be described in more detail below, the circuit arrangement of FIG. 1 improves the PVT range of power consumption by eliminating the voltage as one of the variables by providing VREF receivers whose current consumption is independent of changes in the supply voltage applied to the receiver. The circuits and methods according to an embodiment of the present invention use a bias current generator to create a constant current which is mirrored to the plurality of I/O receivers using a current mirror. The circuits and methods set forth in more detail below reduce power consumption over PVT variations, reduce the circuit requirements by providing a single bias current generator for a plurality of input/output ports of an integrated circuit, and provide a programmable bias current which may be adjusted depending on the required speed of the I/O ports.

Figure 2:
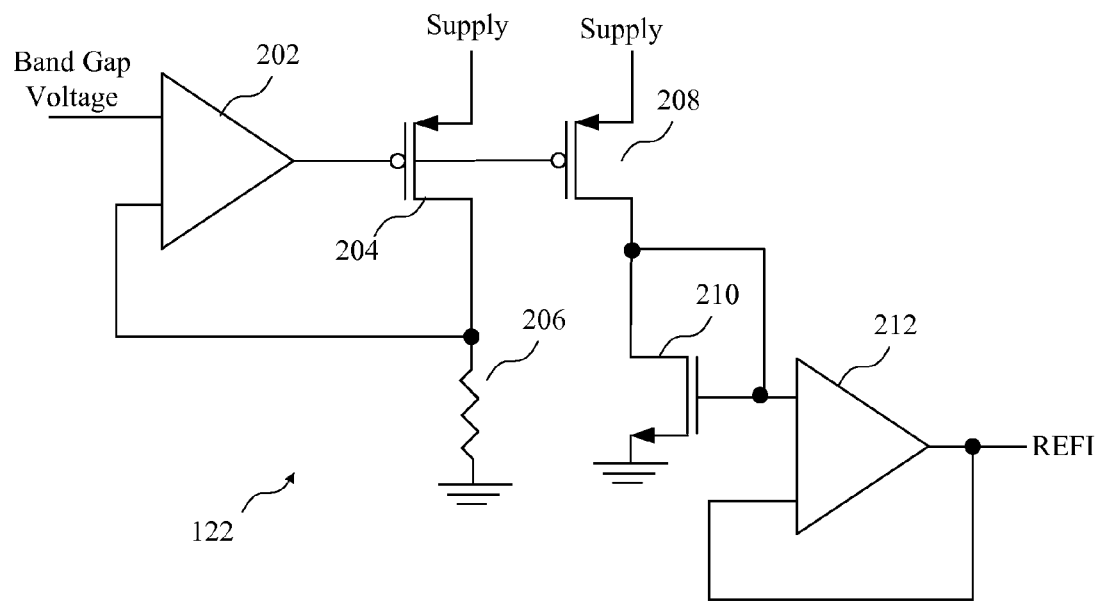
FIG. 2 is a block diagram of the bias current generator of the circuit of FIG. 1 according to an embodiment of the present invention.

Turning now to FIG. 2, a block diagram of the bias current generator 122 of the circuit of FIG. 1 according to an embodiment of the present invention is shown. Two amplifiers are used to generate a reference voltage coupled to a plurality of input/output ports, where one amplifier is used to generate the reference current by using a resistor, and another amplifier is used to drive the reference line. The output of a first amplifier 202 coupled to gates of transistors in two paths of a current mirror. In particular, the output of the amplifier 202 is coupled to the gate of an p-type metal oxide semiconductor (PMOS) transistor having a source coupled to a supply voltage and a drain coupled to a first terminal of a resistor 206 having a second terminal coupled to ground. The amplifier 202 comprises a differential amplifier coupled to receive a fixed voltage at a first input and the voltage at the first terminal of the resistor 206.

The circuit of FIG. 2 is configured as a current mirror where the current generated in the first current path comprising the transistor 204 and resistor 206 is mirrored in a second path comprising a transistor 208 and a transistor 210. In particular, the output of the amplifier 202 is coupled to the gate of a PMOS transistor 208 which also has a source coupled to the supply voltage. The drain of the transistor 208 is coupled to the drain of an n-type metal oxide semiconductor transistor (NMOS) having a source coupled to ground. The drain of the transistor 210 is coupled to its gate at a first input of the second differential amplifier 212, which is also coupled to receive the output REFI of the amplifier as a second input. The output REFI of the amplifier 212 comprises a reference voltage which will vary to maintain the fixed current in the second path of the current mirror. The current mirror configuration of FIG. 2 provides a stable source of current regardless of the load on the bias current generator and is independent of variations in the supply voltage applied to the VREF receivers. As will be described in reference to FIG. 3, the current in the second path of the current mirror is mirrored in each of the VREF receivers.

According to one embodiment of the invention, the circuits and methods use the 1.2V bandgap reference voltage coupled to the first input of the amplifier to create a current which will depend only in the process and the temperature of the device. That is, the bandgap voltage is a stable voltage supply based upon properties of the material of the die, such as properties of a silicon die where the bandgap voltage may be approximately 1.25 volts. The circuit may be placed in the corners of the chip which may not contain circuitry normally found in columns of a device having programmable logic such as the device described in FIG. 5. The REFI pin will be used to bias each of the VREF receivers. By configuring the two parallel paths between the supply voltage and ground, where the gates of the PMOS transistors are coupled to the same voltage and the NMOS transistor is configured as a diode as shown, the current in the two paths will be equal assuming that the PMOS transistors have the same dimensions, such as gate length and gate width, and are manufactured using the same process, such as gate oxide thickness. Although one bias current generator is shown, multiple bias current generators may be employed, where each bias current generator provides the reference current to a plurality of VREF receivers. As will be described in more detail below, the value of the resistor will determine the current in the current mirror, and therefore, the speed of the VREF receivers. According to one embodiment, the value of the resistor is programmable and thus, depending on the speed of the application, the reference current may be increased/decreased to meet the needs of the circuit. While the specific embodiment of FIG. 2 provides one example of a current mirror, other current mirror circuits could be employed according to the present inventions. That is, any current mirror which would use a reliable fixed voltage to generate a first current in a first path and mirror the first current in a second current path could be used, where a reference voltage based upon the current generated in the current mirror would be used to bias the VREF receivers.

Figure 3:
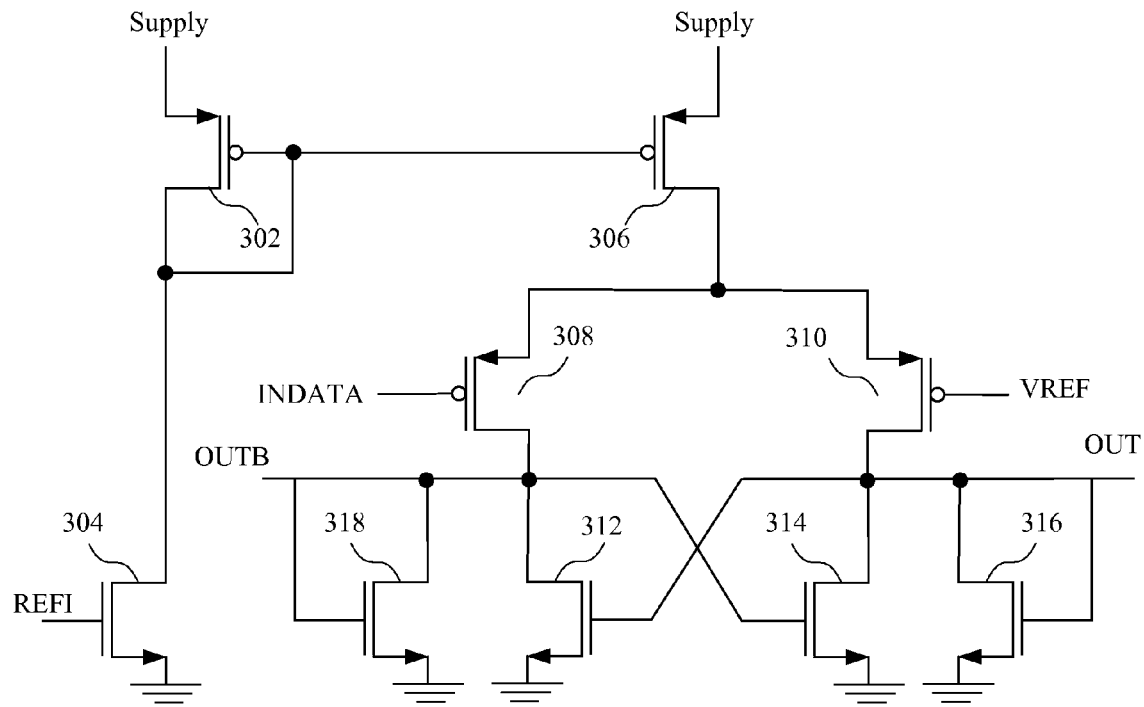
FIG. 3 is a block diagram of the receiver circuit of an input/output port of the circuit of FIG. 1 according to an embodiment of the present invention.

Turning now to FIG. 3, a block diagram of the receiver circuit of an input/output port according to an embodiment of the present invention is shown. The circuit of FIG. 3 comprises a VREF receiver coupled to receive the reference voltage VREF and input data, and will generate an output signal OUT based upon the value of the input data INDATA. In particular, a current path of the VREF receiver comprises a PMOS transistor 302 having a source coupled to a supply voltage and a drain coupled to the drain of an n-channel transistor 304 which is coupled to receive the REFI voltage at its gate. The drain of transistor 302 is coupled to its gate. The current in the second path of the current mirror circuit comprising transistors 208 and 210 of the bias current generator of FIG. 2 is mirrored to the current path comprising transistors 302 and 304 of each VREF receiver to provide a bias current which is mirrored in the remaining part of the circuit. By mirroring the current generated in the bias current generator in the VREF receivers, the current consumption in the VREF receivers is independent of variations in the supply voltage.

The remaining portion of the circuit of FIG. 3 comprises a differential receiver which generates an output signal OUT based upon the relative values of the input data INDATA and the VREF value. The voltage at the drains of transistors 302 and 304 is coupled to the gate of a p-channel transistor 306 having a source coupled to the supply voltage and a drain coupled to the sources of input transistors 308 and 310 to mirror the current in the remaining portion of the circuit. The PMOS transistor 308 is coupled to receive the input data INDATA such as data read from a memory device at its gate, while the PMOS transistor 310 receives the reference voltage VREF at its gate. VREF may have a value of approximately one half of the supply voltage, for example. The drains of transistors 308 and 310 are coupled to cross-coupled transistors 312 and 314, respectively. In particular, the drain of transistor 308 is coupled to the drain of NMOS transistor 312 and the drain of transistor 310 is coupled to the drain of transistor 314. The gate of transistor 312 is coupled to the drains of transistors 310 and 314 and the gate of transistor 314 is coupled to the drains of transistors 308 and 312. An NMOS transistor 316 is coupled between the output node and ground, where the gate of the transistor 316 is coupled to the output node. Finally, an NMOS transistor 318 is coupled between the inverted output node for generating an inverted output signal OUTB, where the gate of the transistor 318 is coupled to OUTB. The VREF Receivers will be biased using the reference current generated in the bias current generator and mirrored in the path comprising transistors 302 and 304, and their current consumption will not be dependent on the supply voltage but only on the value of the reference current.

In operation, when the value of INDATA is low, transistor 308 turns on, pulling OUTB high, which turns on transistor 314 to pull the output signal OUT low. When the value of INDATA is high, transistor 308 is off. Transistor 310 is on, pulling the output high which turns on the transistor 312 to pull the inverted output OUTB low. While a specific receiver circuit is shown by way of example in FIG. 3, the current path comprising transistors 302 and 304 could be implemented with another receiver circuit to provide a VREF receiver which is independent of voltage variations in the circuit. While a VREF receiver is shown in FIG. 3 by way of example, other differential receivers could be employed. For example, an LVDS receiver could be employed by coupling inverted input data (INDATA_B) to the node coupled to receive the VREF voltage of FIG. 5. While the amplifier shown in FIG. 3 may need to be modified to meet a given LVDS standard, the operation of mirroring current to the amplifier is the same.

Figure 4:
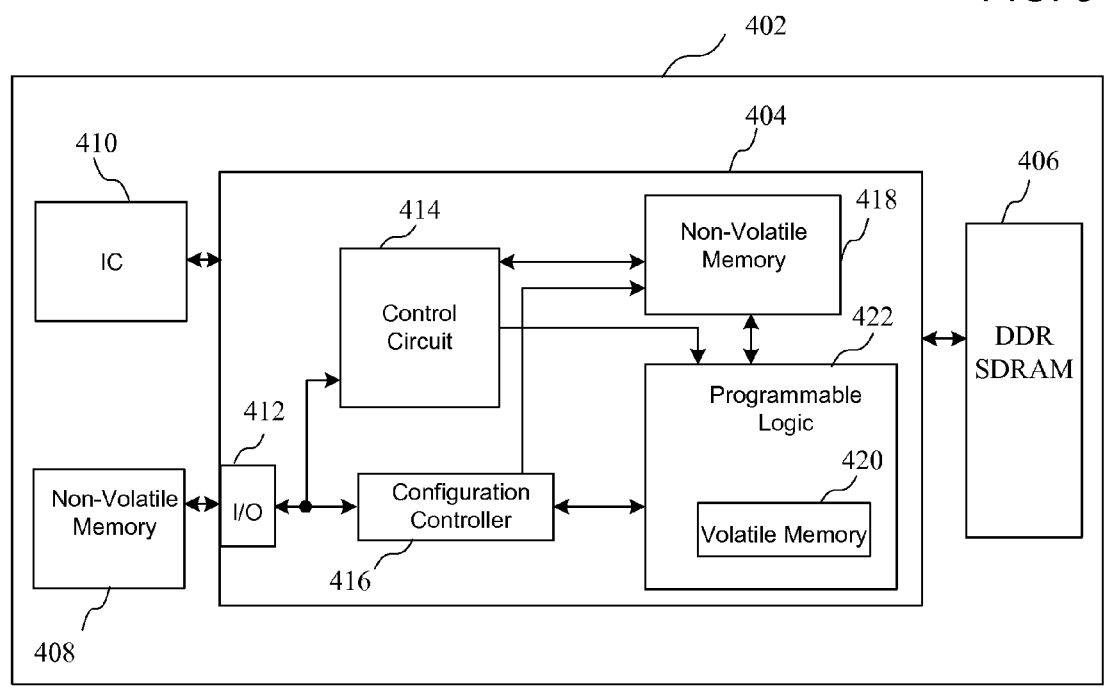
FIG. 4 is a system implementing a circuit for reducing power consumption in input ports of an integrated circuit according to an embodiment of the present invention.

Turning now to FIG. 4, a system implementing a circuit for reducing power consumption in input ports of an integrated circuit according to an embodiment of the present invention is shown. A circuit 402 comprises a device having programmable logic 404 coupled to a memory 406, shown here as a DDR SDRAM. Other devices such as a non-volatile memory 408 or some other integrated circuit 410 may be coupled to the device 404. The non-volatile memory 408 may be coupled to an I/O port 412 of the device 404. A configuration bitstream stored in the non-volatile memory 408 may be coupled to a control circuit 414 or a configuration controller 416 to load the configuration bitstream in the device. The configuration bitstream may be loaded into a non-volatile memory 418 of the device 404 to be loaded into a volatile memory 420 of programmable logic 422. Alternatively, the configuration bitstream may be loaded directly into the volatile memory 420 by the control circuit 414 or the configuration controller 416. A more detailed description of the device 404 is set forth below in reference to FIGS. 5 and 6.

Figure 5:
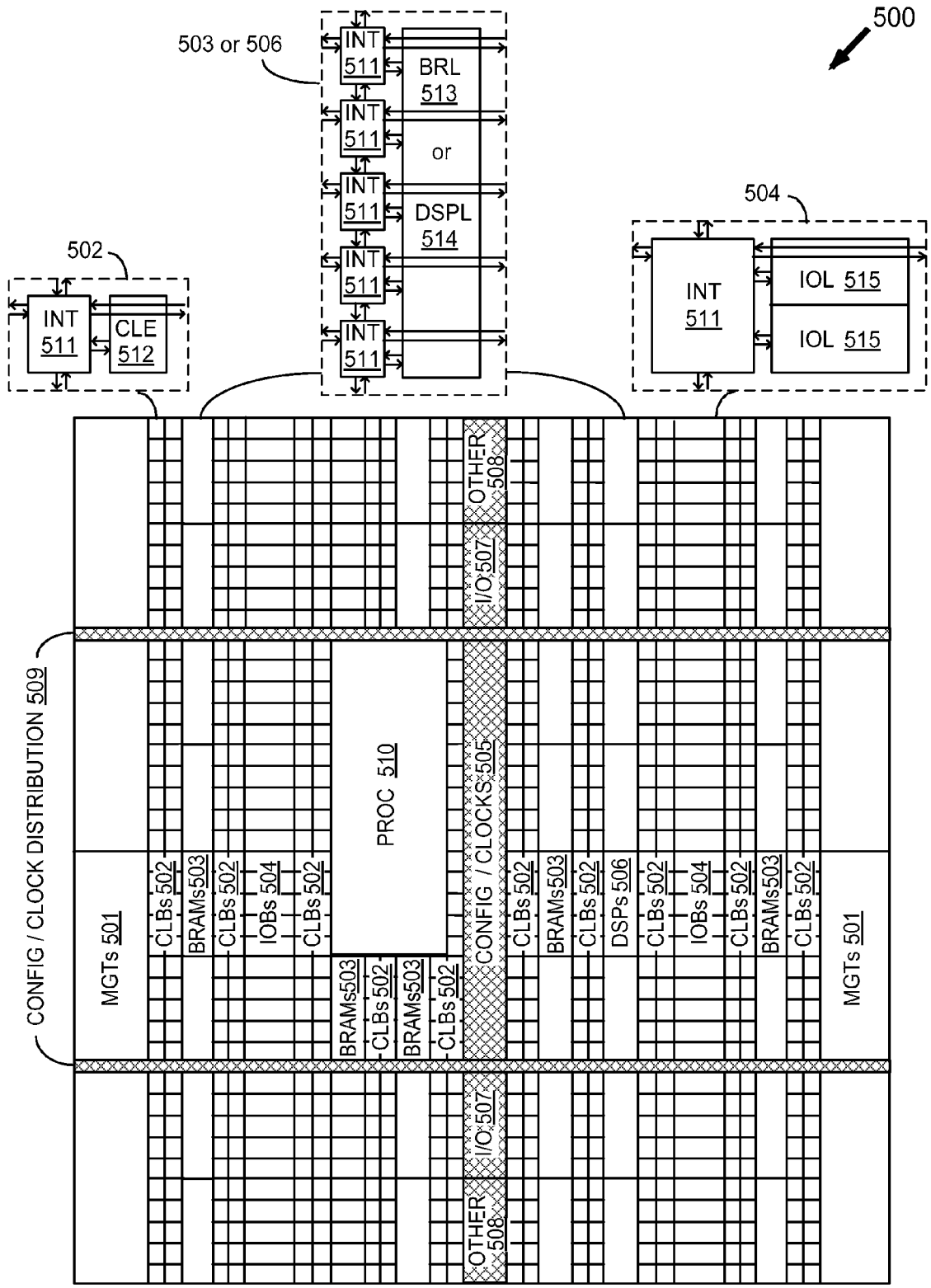
FIG. 5 is a device having programmable logic according to an embodiment of the present invention.

Turning now to FIG. 5, a device having programmable logic according to an embodiment of the present invention is shown. While devices having programmable logic may be implemented in any type of integrated circuit device, such as an application specific integrated circuit (ASIC) having programmable logic, other devices comprise dedicated programmable logic devices. A programmable logic device (PLD) is an integrated circuit device designed to be user-programmable so that users may implement logic designs of their choices. One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 5 comprises an FPGA architecture 500 having a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 may include a configurable logic element (CLE 512) that may be programmed to implement user logic plus a single programmable interconnect element (INT 511). A BRAM 503 may include a BRAM logic element (BRL 513) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 506 may include a DSP logic element (DSPL 514) in addition to an appropriate number of programmable interconnect elements. An IOB 504 may include, for example, two instances of an input/output logic element (IOL 515) in addition to one instance of the programmable interconnect element (INT 511). The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA. Some FPGAs utilizing the architecture illustrated in FIG. 5 include additional logic blocks that disrupt the regular columnar structure making up a large part of the FPGA. The additional logic blocks may be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Figure 6:
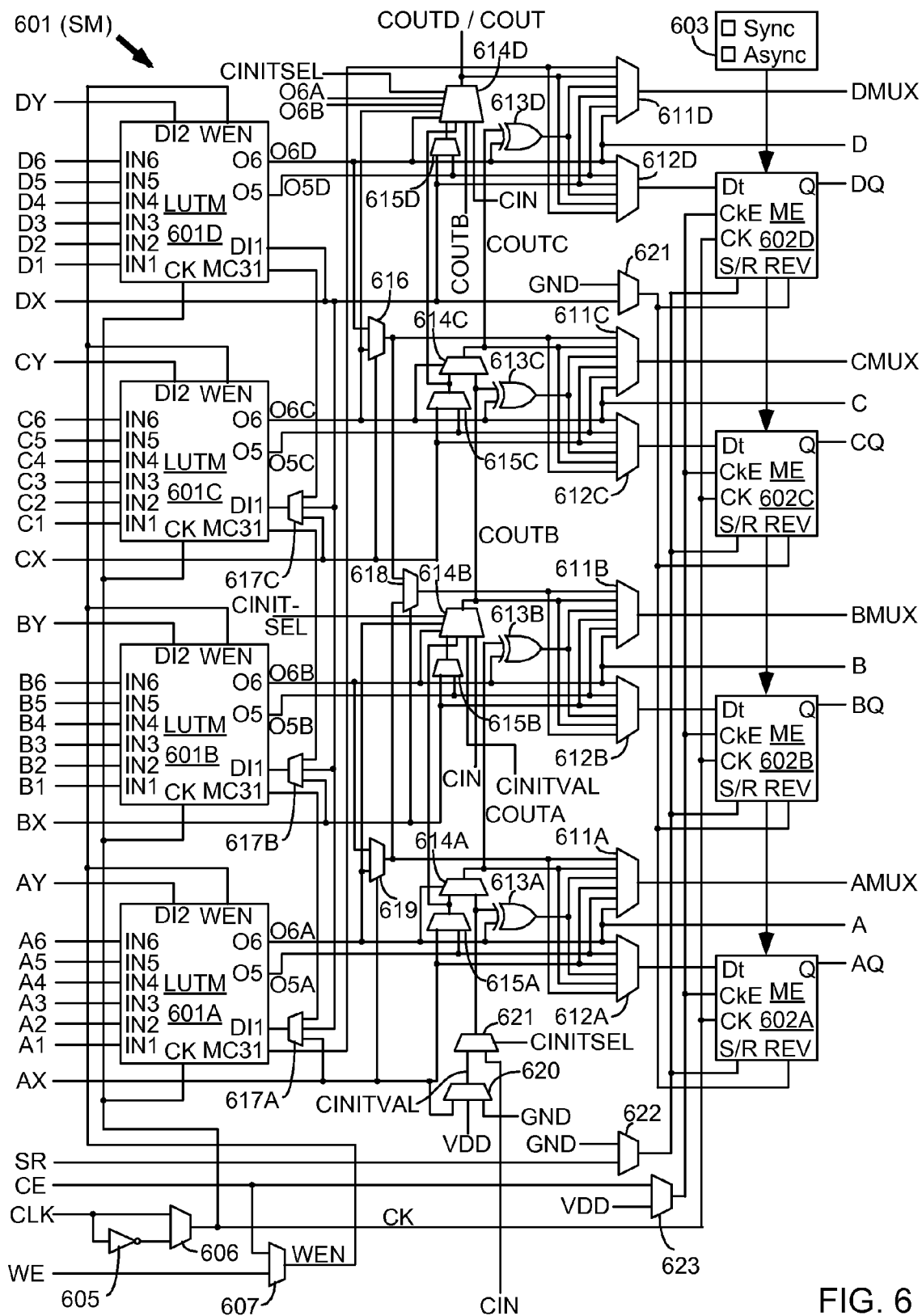
FIG. 6 is a block diagram of a configurable logic element of the device of FIG. 5 according to an embodiment of the present invention.

Turning now to FIG. 6, a block diagram of a configurable logic element of the device of FIG. 5 according to an embodiment of the present invention is shown. In particular, FIG. 6 illustrates in simplified form a configurable logic element of a configuration logic block 502 of FIG. 5. In the embodiment of FIG. 6, slice M 601 includes four lookup tables (LUTMs) 601A-601D, each driven by six LUT data input terminals A1-A6, B1-B6, C1-C6, and D1-D6 and each providing two LUT output signals O5 and O6. The O6 output terminals from LUTs 601A-601D drive slice output terminals A-D, respectively. The LUT data input signals are supplied by the FPGA interconnect structure via input multiplexers, which may be implemented by programmable interconnect element 611, and the LUT output signals are also supplied to the interconnect structure. Slice M also includes: output select multiplexers 611A-611D driving output terminals AMUX-DMUX; multiplexers 612A-612D driving the data input terminals of memory elements 602A-602D; combinational multiplexers 616, 618, and 619; bounce multiplexer circuits 622-623; a circuit represented by inverter 605 and multiplexer 606 (which together provide an optional inversion on the input clock path); and carry logic comprising multiplexers 614A-614D, 615A-615D, 620-621 and exclusive OR gates 613A-613D. All of these elements are coupled together as shown in FIG. 6. Where select inputs are not shown for the multiplexers illustrated in FIG. 6, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 6 for clarity, as well as from other selected figures herein.

In the pictured embodiment, each memory element 602A-602D may be programmed to function as a synchronous or asynchronous flip-flop or latch. The selection between synchronous and asynchronous functionality is made for all four memory elements in a slice by programming Sync/Asynch selection circuit 603. When a memory element is programmed so that the S/R (set/reset) input signal provides a set function, the REV input terminal provides the reset function. When the memory element is programmed so that the S/R input signal provides a reset function, the REV input terminal provides the set function. Memory elements 602A-602D are clocked by a clock signal CK, which may be provided by a global clock network or by the interconnect structure, for example. Such programmable memory elements are well known in the art of FPGA design. Each memory element 602A-602D provides a registered output signal AQ-DQ to the interconnect structure. Because each LUT 601A-601D provides two output signals, O5 and O6, the LUT may be configured to function as two 5-input LUTs with five shared input signals (IN1-IN5), or as one 6-input LUT having input signals IN1-IN6.

In the embodiment of FIG. 6, each LUTM 601A-601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 617A-617C for LUTs 601A-601C), or to the two 32-bit RAMs via input terminals DI1 and DI2. RAM write operations in the LUT RAMs are controlled by clock signal CK from multiplexer 606 and by write enable signal WEN from multiplexer 607, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 601A may also be provided to the general interconnect structure for shift register chaining, via output select multiplexer 611D and CLE output terminal DMUX. The circuits of FIGS. 1-4 and the methods of the present invention may be implemented in the device of FIGS. 5 and 6, or in any suitable device, including any type of integrated circuit having programmable logic. For example, the VREF receivers may be implemented in the IOBs of FIG. 5, while the controller 124 may be implemented in the processor 510 or in a CLB, for example. The datapath control circuit may be implemented in a specialized circuit in the center column of FIG. 5. The bias generator may be placed a corner of the integrated circuit where there may be space for specialized circuits which are not reproduced in columns as shown in FIG. 5.

Figure 7:
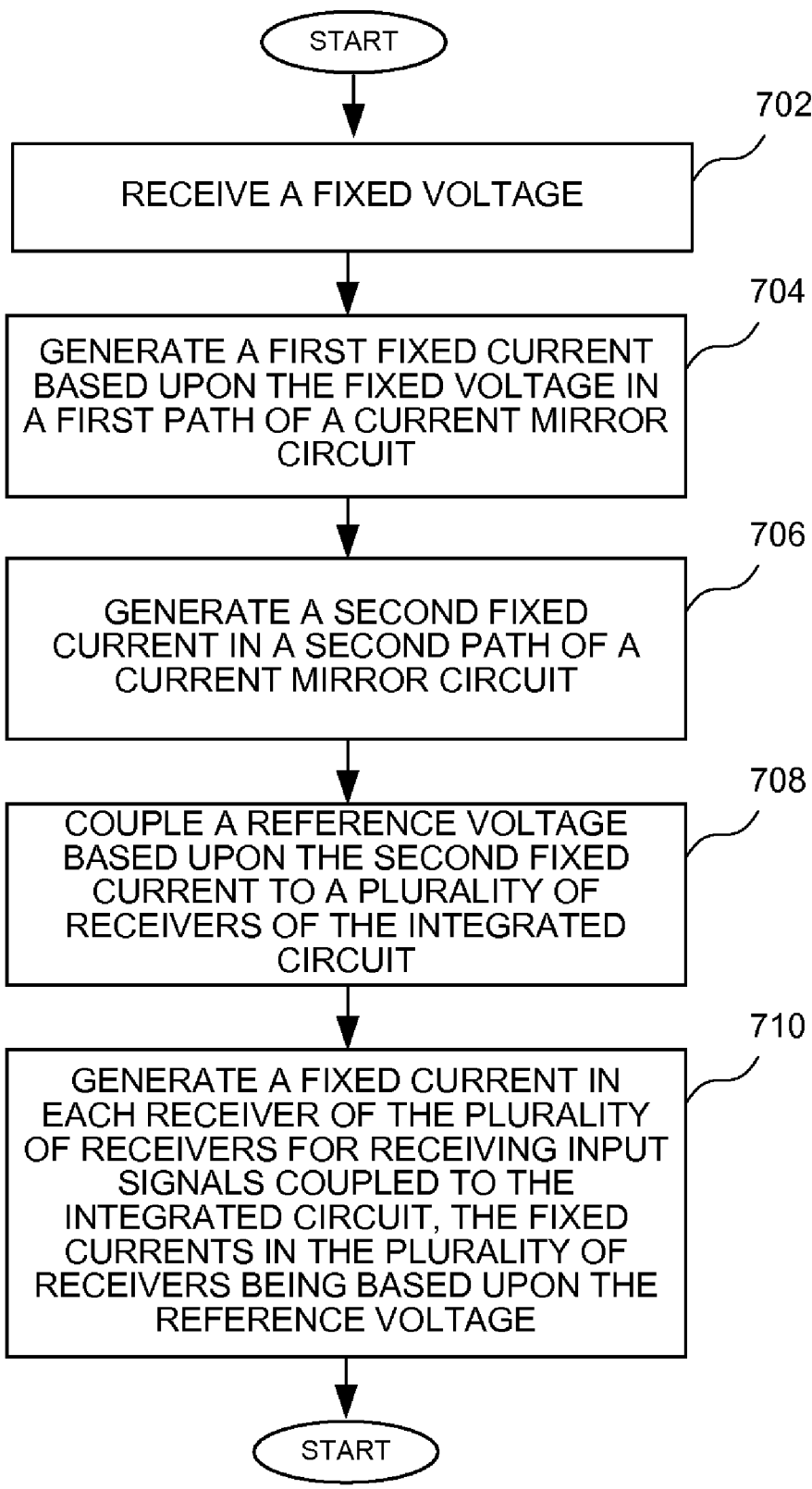
FIG. 7 is a flow chart showing a method of reducing power consumption in an input port of an integrated circuit according to an embodiment the present invention.

Turning now to FIG. 7, a flow chart shows a method of reducing power consumption in input ports of an integrated circuit according to an embodiment the present invention. In particular, a fixed voltage is received at a step 702. The fixed voltage may be a bandgap voltage for the silicon, for example. A first fixed current is generated based upon the fixed voltage in a first path of a current mirror circuit at a step 704. A second fixed current is generated in a second path of a current mirror circuit at a step 706. A reference voltage based upon the second fixed current is coupled to a plurality of receivers of the integrated circuit at a step 708. A fixed current is generated in each receiver of the plurality of receivers for receiving input signals coupled to the integrated circuit at a step 710, where the fixed currents in the plurality of receivers are based upon the reference voltage. That is, by mirroring current from a current generator to a current path in each of the receivers, the method of FIG. 7 enables reducing power consumption in input ports of an integrated circuit by making the current consumed in the input ports independent of changes in the supply voltage. The method of FIG. 7 may be implemented using any of the circuits of FIGS. 1-6 as described, or using any other suitable circuit.

It can therefore be appreciated that the new and novel circuit for and method of reducing power consumption in an input port of an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A circuit for reducing power consumption in input ports of an integrated circuit, the circuit comprising:

a plurality of receiver circuits associated with a plurality of the input ports of the integrated circuit for receiving a plurality of input data signals from a memory coupled to the integrated circuit; and a bias current generator coupled to the plurality of receiver circuits, the bias current generator providing a bias voltage for each receiver circuit of the plurality of receiver circuits to mirror the current in the bias current generator in each of the receiver circuits, the bias current generator comprising a programmable element used to establish a speed of each receiver circuit of the plurality of receiver circuits;

wherein each receiver circuit of the plurality of receiver circuits generates an output data signal based upon an input data signal of the plurality of input data signals.

2. The circuit of claim 1 wherein the bias current generator comprises a first amplifier coupled to receive a bandgap voltage.

3. The circuit of claim 2 wherein an output of the first amplifier is coupled to a first current path for generating a first fixed current.

4. The circuit of claim 3 wherein the first fixed current is based upon a resistor in the first current path.

5. The circuit of claim 4 wherein the programmable element comprises the resistor, the value of the resistor in the first current path being selected to generate a predetermined current for the first fixed current.

6. The circuit of claim 2 further comprising a second current path coupled to the output of the first amplifier, wherein the first fixed current is mirrored in the second current path.

7. The circuit of claim 6 further comprising a second amplifier coupled to the second current path, the second amplifier generating the bias voltage.

8. A circuit for reducing power consumption in input ports of an integrated circuit, the circuit comprising:

a plurality of receiver circuits associated with a plurality of the input ports of the integrated circuit for receiving a plurality of input data signals from a memory coupled to the integrated circuit; and a bias current generator coupled to the plurality of receiver circuits, the bias current generator comprising a first amplifier coupled to receive a first fixed voltage and to generate a first fixed current and a second amplifier coupled to generate a reference voltage based upon the first fixed current, wherein the bias current generator provides the reference voltage to each receiver circuit of the plurality of receiver circuits, the bias current generator comprising a programmable element used to establish a speed of each receiver circuit of the plurality of receiver circuits;

wherein each receiver circuit of the plurality of receiver circuits generates an output data signal based upon an input data signal of the plurality of input data signals.

9. The circuit of claim 8 wherein the first fixed voltage comprises a bandgap voltage.

10. The circuit of claim 8 wherein the first fixed current is based upon a resistor in the first current path.

11. The circuit of claim 10 wherein the programmable element comprises the resistor, the value of the resistor in the first current path being selected to generate a predetermined current for the first fixed current.

12. The circuit of claim 8 wherein the plurality of receiver circuits comprises voltage reference input circuits.

13. The circuit of claim 12 wherein the voltage reference input circuits comprise inputs coupled to receive data from a random access memory.

14. The circuit of claim 8 wherein the bias current generator is implemented in an integrated circuit having programmable resources.

15. A method of reducing power consumption in input ports of an integrated circuit, the method comprising:

setting a programmable element to establish a speed of each receiver of a plurality of receivers;

receiving a fixed voltage;

generating a first fixed current based upon the fixed voltage in a first path of a current mirror circuit;

generating a second fixed current in a second path of a current mirror circuit;

coupling a reference voltage based upon the second fixed current to the plurality of receivers associated with a plurality of the input ports of the integrated circuit;

generating a fixed current in each receiver of the plurality of receivers for receiving a plurality of input data signals coupled from a memory to the integrated circuit, the fixed current in the plurality of receivers being based upon the reference voltage; and generating, at each receiver of the plurality of receivers, an output data signal based upon an input data signal of the plurality of input data signals.

16. The method of claim 15 wherein receiving a fixed voltage comprises receiving a bandgap voltage.

17. The method of claim 15 wherein generating a first fixed current based upon the fixed voltage comprises providing a resistor in the first path of the current mirror.

18. The method of claim 17 wherein generating a first fixed current based upon the fixed voltage comprises using a first differential amplifier coupled to receive the fixed voltage and a voltage at a node of the resistor.

19. The method of claim 18 wherein coupling a reference voltage based upon the second fixed current comprises using a second differential amplifier coupled to a voltage at a node of the second path of the current mirror and an output of the amplifier.

20. The method of claim 15 wherein generating a first fixed current comprises generating a first fixed current based upon the required speed of the plurality of receivers.

* * * * *